United States Patent [19]

Engeler

[11] 4,058,717

[45] Nov. 15, 1977

[54] SURFACE CHARGE SIGNAL PROCESSING APPARATUS

[75] Inventor: William E. Engeler, Scotia, N.Y.

[73] Assignee: General Electric Company, Schenectady, N.Y.

[21] Appl. No.: 702,943

[22] Filed: July 6, 1976

[51] Int. Cl.² .................. G06G 7/19; G11C 11/40
[52] U.S. Cl. ..................... 364/824; 307/221 C; 357/24; 364/862
[58] Field of Search ............... 235/181; 307/221 C, 307/221 D; 357/24

[56] References Cited

U.S. PATENT DOCUMENTS

| 3,935,439 | 1/1976 | Buss et al. | 235/181 |
| 3,956,624 | 5/1976 | Audaire et al. | 307/221 D |
| 3,987,292 | 10/1976 | Means | 235/181 |

OTHER PUBLICATIONS

Moshen et al.: A New Approach to Charge Coupled Devices Clocking, Appl. Physics Lett., vol. 22, No. 4, Feb. 1973, pp. 172/175.
Tiemann et al.: Charge Transfer Devices Filter Complex Communication Signals, Electronics, Nov. 14, 1974, pp. 113/116.

*Primary Examiner*—Felix D. Gruber
*Attorney, Agent, or Firm*—Julius J. Zaskalicky; Joesph T. Cohen; Jerome C. Squillaro

[57] ABSTRACT

A plurality of charge storage cells, each including first and second storage regions, are provided in a semiconductor substrate. Means are provided responsive to a scanning signal for introducing into each of the first charge storage regions a respective quantity of charge proportional to a respective sample of an analog signal. Means are provided responsive to the bits of one value of a digital reference word for maintaining storage of the analog samples in the first storage regions of the cells associated with such bits of one value. Means are provided responsive to bits of the other value of the digital reference word for transferring the analog samples to the second storage regions of the cells associated with such bits of the other value. The charges in all of the cells are transferred concurrently from one storage region to the other and the total net charge transferred to and from the first charge storage regions of all of the cells is sensed on a common conductor overlying all of the first charge storage regions of the cells.

8 Claims, 17 Drawing Figures

Fig. 1.

SURFACE CHARGE SIGNAL PROCESSING APPARATUS

This invention relates in general to signal processing apparatus comprising surface charge transistors and in particular to such apparatus for obtaining the correlation between an analog signal and a digital reference word.

The subject matter of this patent application is related to the subject matter of patent application Ser. No. 702,942 and patent application Ser. No1 702,944, both filed concurrently herewith and assigned to the assignee of the present invention. The aforementioned patent applications are incorporated herein by reference thereto.

In U.S. Pat. No. 3,801,883 assigned to the assignee of this invention, surface charge signal correlation apparatus is described and claimed which includes a semiconductor substrate having a plurality of information channels or cells, each including first, second and third charge storage regions. Means are provided responsive to a scanning signal for introducing into each of the second charge storage regions a respective quantity of electrical charge proportional to a respective sample of an analog signal. Means are provided responsive to the bits of one value in a digital reference word for transferring quantities of charge from second charge storage regions to first charge storage regions of the channels associated with such bits of one value and responsive to the bits of the other value of the digital reference word for transferring quantities of charge from the second charge storage regions to third charge storage regions of the channels associated with such bits of the other value. Means are provided for obtaining a first output representing a signal proportional to the charge transferred to the first charge storage regions of the channels and also for obtaining a second output representing a signal proportional to the charge transferred to the third charge storage regions of the channels. Further means are provided for obtaining the difference of the first and second outputs to obtain a total net output representing the correlation of the analog signal with the digital reference word. The implementation of such apparatus requires relatively complex devices. The rapidity with which correlations are obtained from the apparatus is limited as the operation of such apparatus involves a large number of steps.

The present invention is directed to overcoming limitations such as mentioned above and also is directed to providing improvements in surface charge signal correlation apparatus.

An object of this invention is to provide correlator apparatus using relatively simple surface charge devices organized into apparatus having a relatively simple cycle of operation.

Another object of this invention is to provide surface charge signal correlation apparatus which is capable of operation at high speed.

A further object of this invention is to provide improvements in signal processing apparatus utilizing surface charge devices which include an output electrode common to all of the devices.

In carrying out the invention in an illustrative embodiment thereof, there is provided a substrate of semiconductor material in which a plurality of charge storage cells are formed. Each cell includes a first charge storage region and also a second charge storage region adjacent a major surface of the substrate. The second charge storage region is separated from the first charge storage region by an intermediate region. A first plurality of interconnected electrodes are provided, each electrode insulatingly overlying a respective first charge storage region. A second plurality of electrodes is also provided, each insulatingly overlying a respective second charge storage region. Means are provided for introducing into each of successive ones of the first charge storage regions a respective one of successive quantities of charge, each quantity of charge being proportional to a respective sample of an analog signal. Means are provided for applying to each of the second storage electrodes a voltage waveform selected from a first voltage waveform and a second voltage waveform of the same periodicity in response to a respective one of a series of successive binary bits of a reference word. The bits of a first value in the series of successive bits form a first group of bits and provide the first voltage waveform to the second electrodes associated with a first group of cells. The first voltage waveform causes charges to be transferred during a first interval of a period thereof from the first charge storage regions of the first group of cells to the second charge storage regions thereof, and causes the transferred charge to be returned during a second interval thereof. The bits of a second value in the series of successive bits form a second group of bits and provide the second voltage waveform to the second electrodes associated with a second group of cells. The second voltage waveform causes charge to be transferred from first charge storage regions of the second group of cells to the second charge storage regions thereof during the second interval. Means connected in circuit with the first storage electrodes sense the total net charge transferred to and from the first charge storage regions during the second interval.

The features which are believed to be characteristic of the present invention are set forth with particularity in the appended claims. The invention itself both as to its organization and method of operation, together with further objects and advantages thereof may best be understood by reference to the following description taken in connection with the accompanying drawings in which

Figure 1:
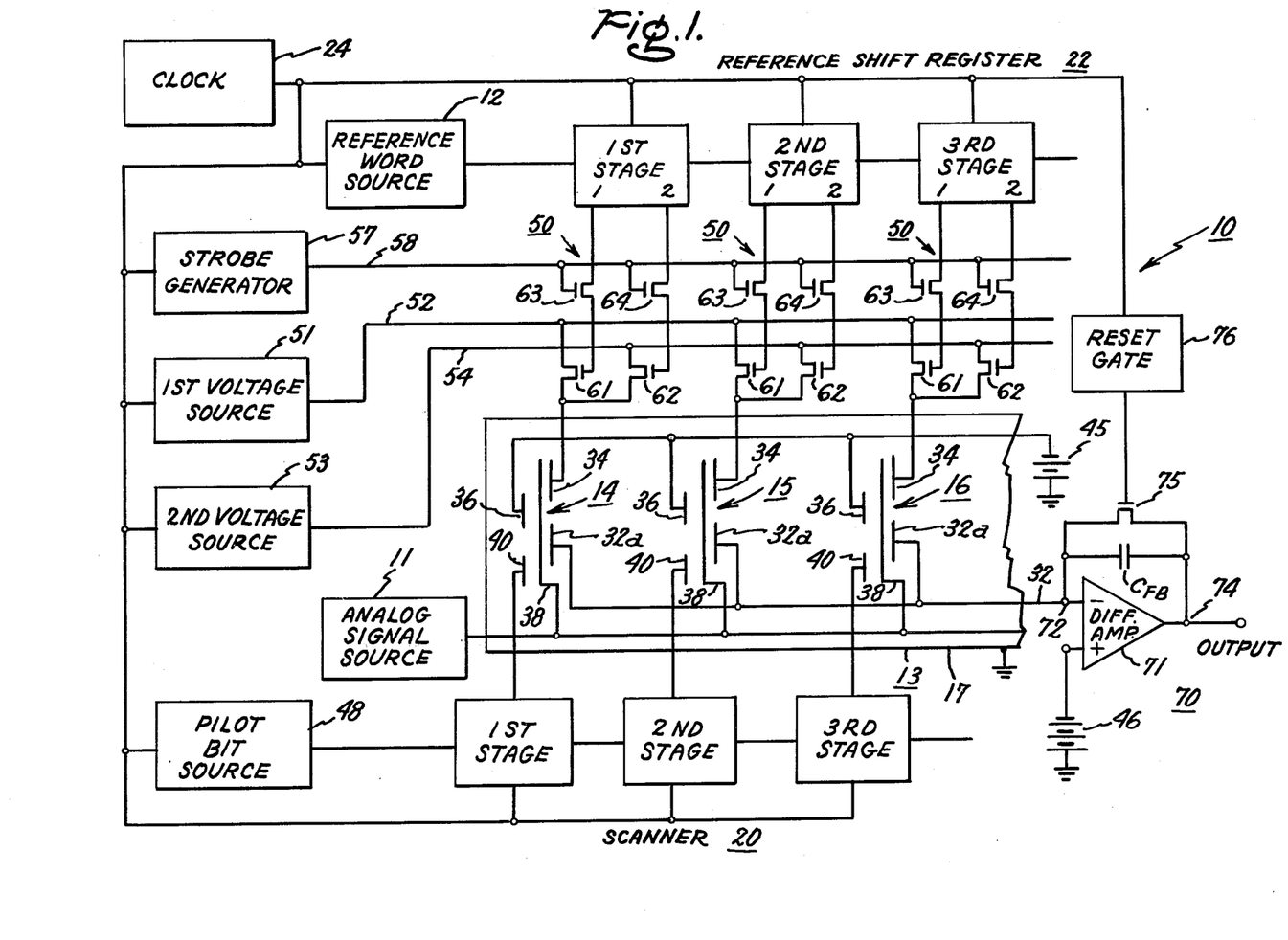
FIG. 1 is a block diagram of surface charge signal correlation apparatus in accordance with an embodiment of the present invention.

Reference is made to FIG. 1 which shows surface charge signal correlation apparatus 10 for obtaining the correlation between a time varying analog signal applied from source 11 and a digital reference word applied from source 12. The apparatus 10 includes an assembly 13 of a plurality of charge transfer devices 14, 15 and 16 formed on a common substrate 17, only three of which are shown for reasons of simplicity in describing the apparatus and explaining the operation thereof. The apparatus also includes a multistage scanner 20, each stage of which is operatively associated with a respective charge transfer device for sequentially gating samples of the analog signal into the charge transfer devices. A reference shift register 22 is also provided, each stage of which is operatively associated with a respective charge transfer device. Successive bits of the reference word are entered and advanced in the successive stages of the reference shift register 22 to control the signal processing in the charge transfer devices 14–16 and thereby to obtain correlations of the analog signal samples with the reference word. The charge transfer devices 14–16, the scanner 20 and the reference shift register 22 as well as the output circuit of the apparatus are under the control of or timed by a source 24 of clock pules. Over a first interval of a cycle of operation of the apparatus the potentials on the electrodes of the devices 14–16 are reset to store each previously introduced quantity of charge corresponding to an analog signal sample into either a first storage region or a second storage region of a respective device depending on the value of the bit of the reference word controlling the device. Over a second interval of the cycle of operation the potentials on the electrodes of the devices are changed to transfer the quantities of stored charge within the devices and obtain a read out as will be explained below in more detail. Each of the analog signal samples is loaded into a respective device during a third interval which either precedes or follows the first and second intervals in a cycle of operation of the apparatus.

Figure 2:
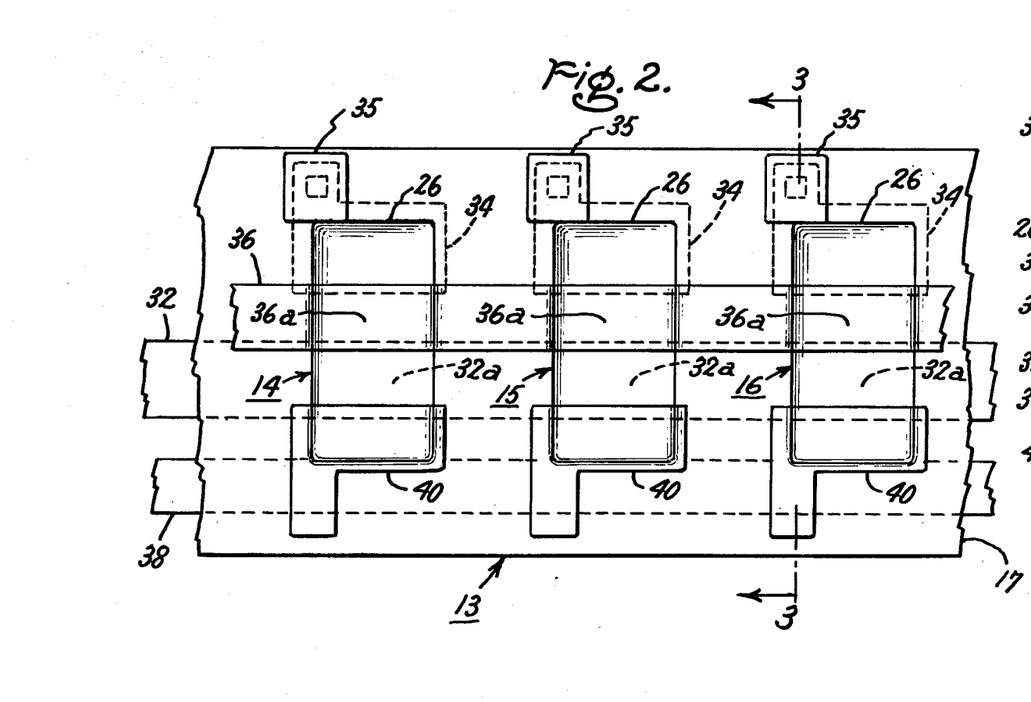
FIG. 2 is a plan view of an assembly of several charge storage cells of the surface charge signal correlation apparatus of FIG. 2 integrated on a single substrate.
Figure 3:
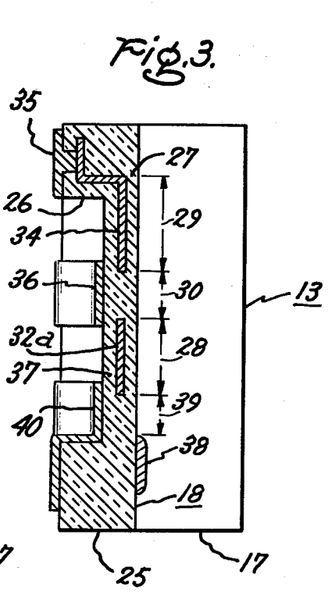
FIG. 3 is a sectional view of the assembly of FIG. 2 taken along sectional lines 3—3 thereof.

As shown in FIGS. 2 and 3, the devices 14–16 are formed on a common substrate 17 of, for example, N-type conductivity silicon of suitable resistivity. The substrate is provided with a major surface 18. A layer of thick insulation 25 which may conveniently be silicon dioxide is provided overlying the major surface 18. A plurality of generally rectangular recesses 26 are provided in the thick insulating member 25, each recess corresponding to the location of a respective charge transfer device. Each of the recesses 26 extends to within a short distance of the major surface of the semiconductor substrate to provide a region of thin insulation 27 lying over the substrate and defining a charge transfer cell therein. Each of the charge transfer cells 14–16 includes a first charge storage region 28 and a second charge storage region 29 spaced from the first charge storage region and defining a respective first intermediate region 30 therebetween, all adjacent the major surface 18. Overlying the thick and thin portions of the insulating member and extending generally perpendicular to the long dimension of the recesses 26 is a conductive member or line 32. The portions of the conducting member 32 lying in the recesses constitute a first plurality of electrodes 32a, each electrode overlying a respective first storage region 28 of a charge transfer device or cell. A second plurality of electrodes 34 are provided, each electrode in a respective recess and each overlying a respective second charge storage region 29 in the charge transfer cells. Terminals 35 provide electrical connection to the electrodes 34. A second layer 37 of thin insulation is provided in each of the recesses 26. Overlying the thick and thin portions of the insulating member and extending generally perpendicular to the long dimension of the recesses 26 is a conductive member or line 36. The portions of the conductive member 36 lying in the recesses constitute a first plurality of gating electrodes 36a, each overlying a respective intermediate region 30. Also provided in the semiconductor substrate is a diffused region 38 of P-type conductivity spaced from the first charge storage regions 28 of each of the cells and defining a respective second intermediate region 39 therebetween. A second plurality of gating electrodes 40 are provided, each in their respective recess and each overlying a respective second intermediate region 39.

Referring now particularly to FIG. 1., the first gating electrodes 36 of each of the devices 14–16 are connected to the negative terminal of a source 45 of potential, the positive terminal of which is connected to ground to establish a surface potential in each of the first intermediate regions 30 of a fixed first value. Each of the first storage electrodes 32a of each of the devices 14–16 are interconnected by the line 32 which can be set at a fixed second potential for establishing in each of the first storage regions a depletion surface potential of a second value, as will be explained below. The manner in which the potential of the line 32 is set at the fixed value is by means of a differential amplifier connected to a source 46 of fixed potential, as will also be explained below. The source 46 of potential is set to provide the second value of depletion surface potential to be less in absolute magnitude than the fixed first value of surface depletion potential. The diffused region 38 of opposite conductivity type is connected to an analog signal source 11. Each of the second gating electrodes 40 is connected to a respective stage of the scanner 20. In response to a pilot bit applied to the scanner 20 from a pilot bit source 48, a pulse is applied to each of the second gating electrodes 40 in sequence during the third interval of the cycle of operation mentioned above to sample the analog signal appearing on the diffused region 38 and transfer into each of the first storage regions 28 of the devices in sequence to a respective quantity of charge proportional to a respective sample of the analog signal, as will be explained in more detail below.

A plurality of control circuits 50 are provided, each under the control of a respective stage of reference shift register 22 for applying either a first voltage waveform or a second voltage waveform to a respective second storage electrode 34 depending upon whether a "1" or a "0" of a binary reference word is stored in the stage. The first voltage waveform establishes a first level of depletion surface potential in the second storage regions during a first interval thereof and establishes a second level of depletion surface potential during a succeeding second interval thereof. The first level of depletion surface potential is greater in absolute magnitude than the aforementioned fixed first value of depletion surface potential and the second level of depletion surface potential is less in absolute magnitude than the aforementioned second value of depletion surface potential. The second voltage waveform establishes the aforementioned second level of depletion surface potential in the second storage region during the aforementioned first interval and establishes the aforementioned first level of depletion surface potential during the aforementioned second interval. The first level of depletion surface potential in the second storage regions allows charge stored in the first storage regions to flow into the second storage regions. The second level of depletion surface potential in the second storage regions causes charge stored therein to flow out into the first storage regions. The first voltage waveform is obtained from the output of a first voltage source 51 which is synchronized with the clock 24 and is applied to a first buss 52. The second voltage waveform is obtained from a second voltage source 53 which is synchronized with the clock 24 and is applied to a second buss 54.

The reference shift register 22 is under the control of the clock pulse source 24 which causes bits stored in the shift register to shift a cycle at a time from one stage to the next. Bits of the reference word are applied from a reference word source 12 which is also synchronized by the clock 24 to enter the bits in sequence into the shift register 22. Each of the stages of the reference shift register 22 have two output terminals, designated 1 and 2. When a bit, for example a "1", is stored in a stage of the shift register, the output at terminal 1 is high in absolute magnitude and the output at terminal 2 is low, and conversely when a "0" appears in that stage the output at terminal 1 is low and the output at the terminal 2 is high. A strobe generator 57 synchronized with the clock 24 provides at a third buss 58 a gating pulse during the aforementioned third interval of a clock cycle.

Each of the second electrodes 34 of the charge transfer devices 14–16 is connected through the source to drain conduction path of a respective first MOSFET transistor 61 to the first buss 52. Each of the second electrodes 34 is also connected through the source to drain conduction path of a respective second transistor 62 to the second buss 54. Each of the gates of the first transistors 61 is connected through the source to drain conduction path of a third respective transistor 63 to terminal 1 of a respective stage of the shift register 22.

Each of the gates of the second transistors 62 is connected through the source to drain conduction path of a respective fourth transistor 64 to terminal 2 of a respective stage of the shift register 22. the gates of the third and fourth transistors 63 and 64 are connected to the third or strobe buss 58. Thus, during the third interval of a cycle of the clock, the third and fourth transistors 63 and 64 are "ON" enabling signals appearing on the first and second terminals of a stage of the shift register to be applied to the gates of the first and second transistor 61 and 62. If the bit stored in a stage is a "1", the output appearing at the terminal 1 is high, and accordingly the first transistor 61 is turned "ON". As the output appearing at terminal 2 of the stage is low the second transistor 62 is not turned "ON". Thus, only the first voltage waveform is applied to the second storage electrode 34. While the strobe pulse on buss 58 appears only during the third interval of a cycle and turns the third and fourth transistors "ON" and "OFF", the gate of the first transistor 61 remains "ON" due to gate capacitance. Thus, the first voltage is applied to the second storage electrode during the occurrence of the strobe pulse and continues to be applied to the second storage electrode for the remainder of a cycle including the first and second intervals. Similarly, if a "0" had been stored in the first stage, the output at terminal 1 would be low and the output at terminal 2 would be high, and accordingly the second voltage waveform appearing on the second buss 54 would have been applied to the second storage electrode 34.

Thus, it is apparent that when the first voltage waveform is applied to a second electrode of one of the devices 14–16 in response to a "1" appearing in the corresponding stage of the reference shift register, a packet of charge representing the analog sample stored in the first storage region is transferred into the second storage region over the first interval of time. Over the second interval of time, as the depletion surface potential of the second storage region is raised above the depletion surface potential of the first storage region charge, the packet of charge is transferred back into the first storage region causing a signal to be induced on the output buss 32 representative of the packet of charge transferred during the second interval. Similarly, when the second voltage waveform is applied to a second storage electrode in response to a "0" appearing in a corresponding stage of the reference shift register no charge is transferred from the first charge storage region to the second charge storage region during the first interval of a cycle and during the second interval charge is transferred from the first storage region into the second storage region as the depletion surface potential of the second storage region is lowered below the depletion surface potential of the first storage region. Thus, during the second interval a signal is induced on the output line 32 opposite in sign to the signal induced in the case when the first voltage waveform was applied.

The electrode 32 to which all of the first storage electrodes 32a are connected serves as the output electrode on which is induced a signal proportional to the total net charge transferred to and from the first charge storage regions 28 during the second interval of a cycle of operation. For the purpose of deriving the output signal and also for the purpose of setting and maintaining the potential on the line 32 at a fixed value during the time of analog signal sampling, the output circuit 70 including differential amplifier 71 is provided. The differential amplifier 71 comprises a high gain differential amplifier having an inverting input terminal 72 and a noninverting input terminal 73 and an output terminal 74. The differential amplifier may be any of a variety of operational amplifiers commercially available for example, operational amplifier LM 318 available from National Semiconductor Co. of Santa Clara, Calif. The inverting input terminal 72 is connected to the output line 32. The output terminal 74 is connected to the inverting terminal 72 through a feedback capacitance $C_{FB}$. The non-inverting terminal 73 is connected to the negative terminal of a source 46 of voltage, the positive terminal of which is connected to ground. The potential of the inverting terminal 72 of the high gain differential amplifier with capacitance feedback follows the potential of the noninverting terminal 73. Thus, the differential amplifier delivers a voltage at the output terminal 74 which is proportional to the difference in induced charge on the output line 32 divided by the feedback capacitance $C_{FB}$. A reset switch in the form of a MOSFET transistor 75 is connected across the feedback capacitance $C_{FB}$. When a reset voltage from reset gate generator 76 which is synchronized with clock 24 is applied to the gate of the reset transistor 75, the potential applied to the output line 32 is equal to the potential of the source 46. When the reset switch 75 is opened and thereafter charge is transferred to the first storage regions 28 of the devices 14–16 underlying the first storage electrodes 32a, a signal is induced on the output line 32. The differential amplifier 71 with capacitance feedback operates to maintain the potential on the output line 32 the same as the potential at the non-inverting terminal 73. The resulting charge flow in the output circuit of the amplifier and to the capacitor $C_{FB}$ produces a voltage at output terminal 74 which is proportional to the total net charge transferred to the first storage regions 28. The aforementioned charge sensing circuit is described and claimed in U.S. patent application Ser. No. 591,636, filed June 30, 1975, now U.S. Pat. No. 3,969,636. Alternative means may be provided to sense on the output line 32 the total net charge transferred to the first storage regions 28. For example, after resetting the output line 32, it may be allowed to float and the change in potential thereon sensed to provide the output signal.

The operation of the correlator apparatus of FIG. 1 over a cycle of operation will now be explained in connection with the waveform diagrams of FIGS. 4A through 4H and also in connection with the surface potential diagrams of FIGS. 5A through 5C and FIGS. 6A through 6C. To facilitate description of the operation of the correlator apparatus, specific values of depletion surface potentials in the various regions of the charge transfer devices 14–16 are shown in FIGS. 5A through 5C and FIGS. 6A through 6C. These potentials are produced by applying suitable voltages to the electrodes overlying the various regions of the devices, for example, several volts higher than the indicated depletion surface potentials. The voltages required on the electrodes depends on the materials used and other geometric details for the devices as is well known to those skilled in the art.

Figure 4A:
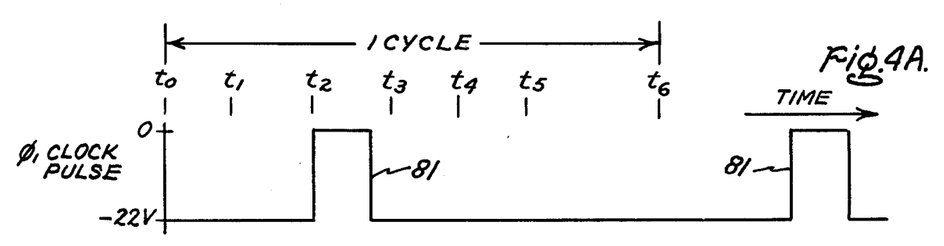
FIG. 4A thru 4G are diagrams of amplitude versus time of voltage signals occurring at various points in the apparatus of FIG. 1.
Figure 4B:
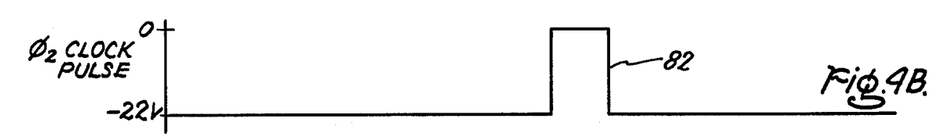
Figure 4C:
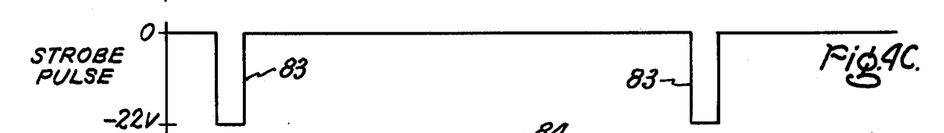
Figure 4D:
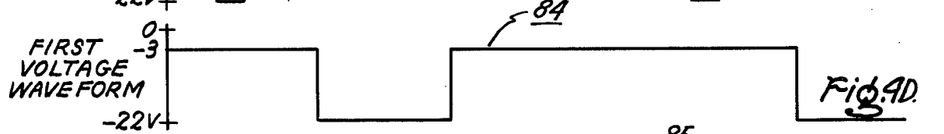
Figure 4E:
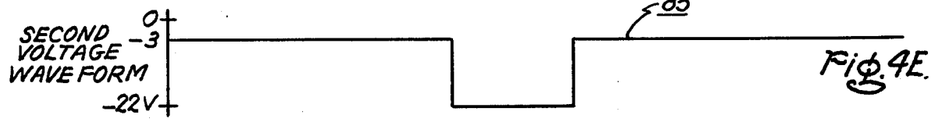
Figure 4F:
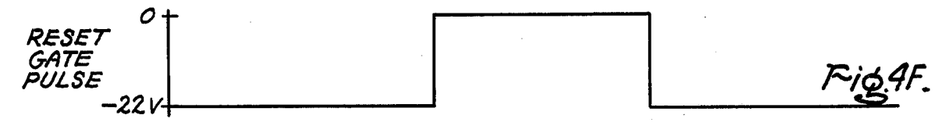
Figure 4G:
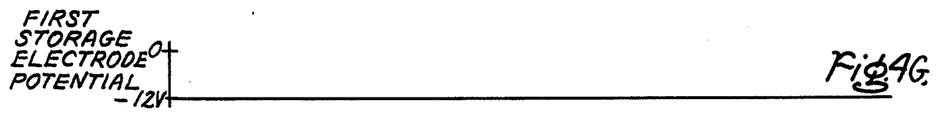
Figure 4H:
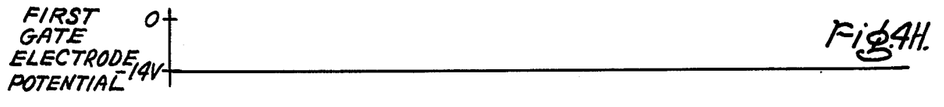

FIGS. 4A through 4H show waveforms of voltages appearing at various points in the apparatus of FIG. 1 over a period greater than one clock cycle but less than two clock cycles of operation thereof. All of the waveforms are drawn to a common time scale. Each cycle of operation is constituted of three intervals, interval from $t_0$ to $t_2$ is referred to as the third interval, the interval from $t_2$ to $t_4$ is referred to as the first interval and the interval from $t_4$ to $t_6$ is referred to as the second interval. FIG. 4A shows pulses 81 of a first phase voltage $\phi_1$ obtained from the clock 24 and FIG. 4B shows pulses 82 of a second phase voltage $\phi_2$ obtained from the clock. The first phase and second phase clock pulses are utilized to drive the scanner 20 and also to drive the reference shift register 22. FIG. 4C shows a strobe pulse 83 appearing in first interval of a cycle for enabling either the first voltage waveform or the second voltage waveform, referred to above, to be applied to a second storage electrode 34 depending on the bit stored in the shift register stage associated with that electrode. FIG. 4D shows the first voltage waveform 84 which is applied to a second storage electrode 34 of a charge transfer device in response to a logic "1" bit appearing in the associated stage of the reference shift register 22. FIG. 4E shows the second voltage waveform 75 which is applied to the second electrode of a charge transfer device when a logic "0" bit appears in the associated stage of the reference shift register 22. FIG 4F shows the pulse applied to the gate of the reset transistor 75 of the differential amplifier to discharge feedback capacitance $C_{FB}$ during the third and first intervals of a cycle of operation and to release the operation of the differential amplifier 71 just prior to the second or read interval of the cycle to provide an output proportional to the total net transfer of charge to and from the first storage regions 28 underlying electrodes 32a of charge transfer devices during the second or read interval. FIG. 4G shows the potential of the first storage electrodes 32a and the output line 32 of the apparatus. FIG. 4H shows the potential applied to the first gate electrodes 36a of the charge transfer devices.

Figures 5A, 6A:
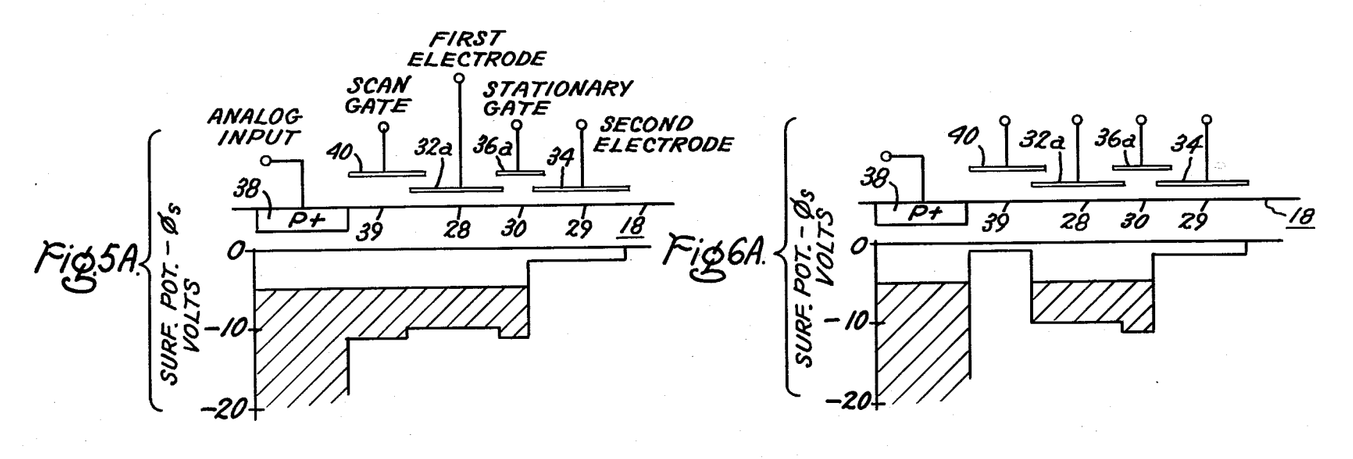
FIG. 5A shows a sectional view of a charge storage cell of the apparatus of FIG. 1 and also includes a diagram of semiconductor surface potential versus distance along the semiconductor surface at an instant of time in a third interval or phase of a cycle of operation of the apparatus, referred to as the load phase, when a logic 1signal (a gating pulse) is applied to the scan gate from the scanner.
FIG. 6A also shows a sectional view of a cell of the apparatus of FIG. 1 and also includes a diagram of surface potential versus distance along the semiconductor surface at an instant of time in the third interval or phase of a cycle of operation of the apparatus, referred to as the load phase, when a logic 0 signal (no gating pulse) is applied to the scan gate from the scanner.
Figures 5B, 5C, 6B, 6C:
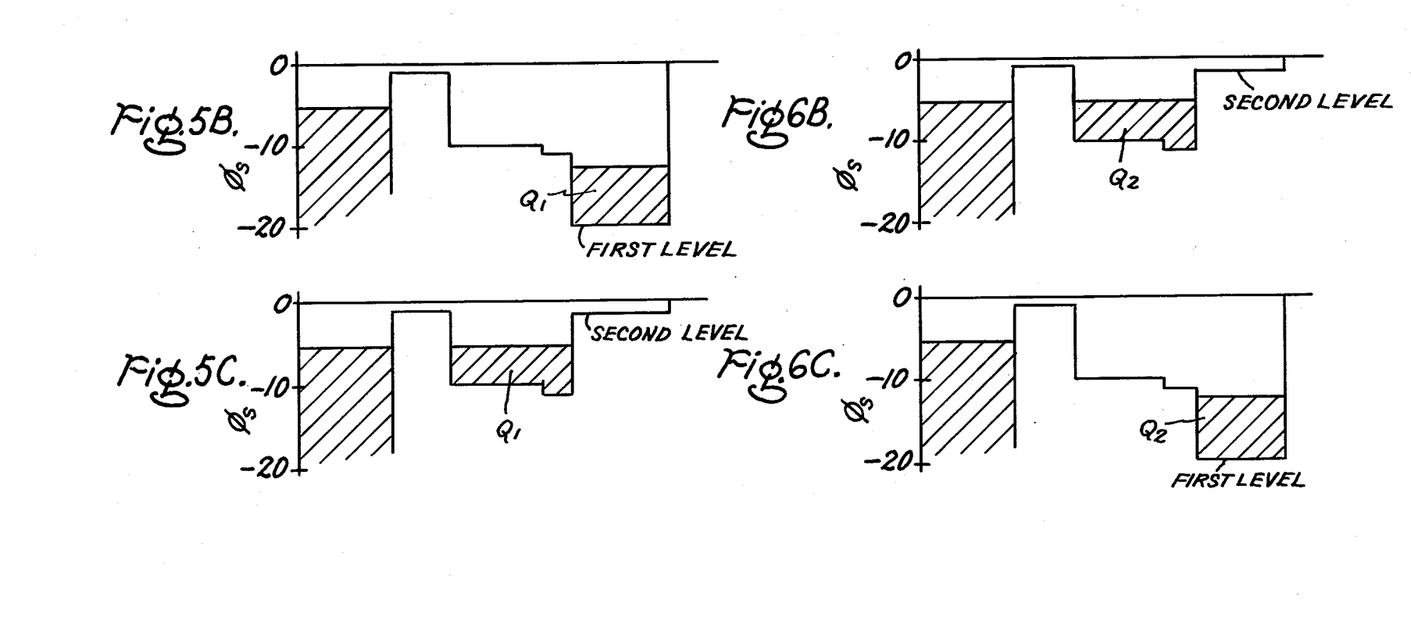
FIG. 5B is a diagram of semiconductor surface potential versus distance along the semiconductor surface at an instant of time in the first interval or phase of a cycle of operation of the apparatus of FIG. 1, referred to as the reset phase when no pulse appears on the scan gate and when a logic 1signal controls the voltage waveform applied to the second storage electrode of the cell.
FIG. 5C is a diagram of the semiconductor surface potential versus distance along the semiconductor surface of a cell at an instant of time in the second interval or phase of a cycle of operation of the apparatus of FIG. 1, referred to as the read phase, when a logic 1 signal controls the voltage waveform applied to the second storage electrode of the cell.
FIG. 6B is a diagram of semiconductor surface potential versus distance along the semiconductor surface at an instant of time in the first interval or phase of a cycle of operation of the apparatus of FIG. 1, referred to as the reset phase, when a logic 0 signal controls the voltage waveform applied to the second storage electrode of the cell.
FIG. 6C is a diagram of the semiconductor surface potential versus distance along the semiconductor surface of a cell at an instant of time in the second interval or phase of a cycle of operation of the apparatus of FIG. 1, referred to as the read phase, when a logic 0 signal controls the voltage waveform applied to the second storage electrode of the cell.

With the apparatus operating under control of the clock 24, an analog signal is applied to the analog line or diffused region 38 from the analog signal source 11. A pilot bit is applied to the first stage of the scanner 20 and is clocked from one stage to the next in the scanner in synchronism with the clock 24. Bits of a reference word are applied from the reference word source 12 to the first stage of the reference shift register 22 and are clocked bit by bit from one stage to the next in synchronism with the clock. Consider the sequence of operation of a single charge transfer device, in particular the first charge transfer device 14, assuming that a pilot bit appears in the first stage of the scanner 20 and that a logic "1" bit also appears in the first stage of the reference shift register 22. The conditions existing in the charge transfer device at the instant $t_1$ in the third interval of the cycle of operation thereof is depicted in FIG. 5A. The logic "1" condition in the first stage of the scanner lowers the surface potential under the scan gate 40 and allows charge to flow from the diffused region 38 into the first storage region 28 and equilibrate with the amplitude of the signal at that instant of time. On termination of the pulse on the scan gate 40 a quantity of charge $Q_1$ is stored in the first storage region underlying the first storage electrode which is proportional to the amplitude of the analog signal. At the same instant of time $t_1$ a strobe pulse is applied to the control circuit 50 of the first device 14 and as a logic "1" bit appears in the first stage of the reference shift register 22, the first voltage waveform 74 is applied to the second storage electrode 34. As the first voltage waveform is −3 volts over the third interval, $t_0$–$t_2$, none of the charge in the diffused region 38 flows into the second storage region 29 underlying the second electrode 34. During the first interval, $t_2$–$t_4$, the first voltage waveform drops to a value of $-22$ volts thereby enabling the quantity or packet of charge stored in the first storage region to flow into the second storage region underlying the second storage electrode as shown in FIG. 5B and would, for example, represent the condition existing at instant of time $t_3$ in the first interval. During the second interval, $t_4$–$t_6$, the first voltage rises to $-3$ volts again and causes the charge in the second storage region to flow back into the first storage region. The condition in the second interval at the instant $t_5$ is shown in FIG. 5C. Just prior to the rise of the first voltage to the $-3$ volts, the reset switch 75 is opened and the charge flowing into the first storage region is sensed on line 32 by the output charge sensing circuit, as explained above.

Consider now the operation of the second charge transfer device 15 over the same cycle. Assume a logic "0" condition exists in the second stage of scanner 20 and no pulse appears on the scan gate 40 of the device. Thus, during the interval $t_0$–$t_2$ the charge $Q_2$ that had been previously stored in the first storage region of the device continues to be stored therein. As the bit stored in the second stage of the reference shift register 22 is a "0", upon appearance of the strobe pulse during the third interval, $t_0$–$t_2$, a high level appears at terminal 2 of the second stage thereby actuating the gate of the second transistor 62 to apply the second voltage waveform 75 to the second electrode 34 of the second device 15. During the third interval of the time as shown in FIG. 4E the second voltage waveform is $-3$ volts. Accordingly, the charge $Q_2$ continues to be stored in the first storage region under the first electrode 32a, as shown in FIG 6A. The charge conditions existing in the charge transfer device at the time $t_3$ in the first interval is as shown in FIG. 6B. During the first interval of time the second voltage waveform 75 continues at $-3$ volts. During the second interval of time the second voltage waveform drops to $-22$ volts thereby allowing the charge stored in the first storage region to flow into the second storage region, as depicted in FIG. 6C at the instant $t_5$. The flow of charge out of the storage region underlying the first electrode induces a signal on the electrode 32a opposite to the signal induced when charge is transferred into the storage region lying thereunder. Thus, as charge was transferred into the first storage region of the first device 14 during the second or read interval and charge was transferred out of the first storage region of the second device 15 during the second or read interval, a signal is developed on the output line 32 which represents the net transfer of charge in the two devices. Similar action takes place in each of the other devices of the apparatus. Accordingly, at each clock cycle a correlation output is obtained at the output terminal 74 of the differential amplifier circuit 71. Mathematically the output $V_{out}$ may be represented by the equation:

$$V_{out} = K \Sigma Q_n W_n$$

wherein $Q_n$ is the charge stored in the $n^{th}$ cell; $W_n$ is equal to $+1$ if the binary bit located in the $n^{th}$ stage of the reference shift register is a logic "1" bit, and $W_n$ is equal to $-1$ if the $n^{th}$ bit is a logic "0" bit; and $K$ is a constant.

In the operation of the charge transfer devices 14 and 15 in the examples described above, after the voltage levels of the first and second voltage waveforms 84 and 85 applied to second electrodes 34 are switched, surface potentials are set up in the devices energetically favorable to charge transfer in the storage regions thereof. In device 14 the charge transfers from the second storage region to the first storage region and in device 15 the charge transfers from the first storage region to the second storage region thereof. Both charge transfers take place over a finite period of time with the major portion of charge transferring in times less than a few nanoseconds. The switched voltage levels of the first and second voltage waveforms in the second interval are maintained for a sufficient period of time such that all the charge is transferred. Such a period is indicated in FIGS. 4D and 4E from time $t_4$ to time $t_5$, for example. In correlator apparatus utilizing surface charge devices formed on N-type substrates, referred to as P-channel devices, all operated in the manner described herein, frequencies of operation as high as 10 megahertz have been attained.

In the surface charge signal correlation apparatus of the aforementioned U.S. Pat. No. 3,801,883 described in brief above, the charge transfer device constituting the signal processing channels or cells included at least three storage regions and a plurality of gating electrodes as well as a pair of output lines. In each of the devices an analog signal sample is stored in a second storage region and is transferred into either an adjacent first storage region or into an adjacent third storage region depending upon whether a "1" or a "0" appeared in the associated stage of the reference word shift register. A first output appears on a first line representing the summation of the analog signal samples summed with one sign and a second output appears on a second line representing the summation of the analog signal samples summed with the opposite sign. A differential amplifier is provided to obtain the correlation output. In accordance with the present invention the charge transfer devices utilized in the apparatus are of simpler structure utilizing just two storage regions. In addition the correlation output is obtained directly on a single line which directly sums the analog signal samples with one and the opposite sign depending upon whether charge is transferred into or out of a storage region underlying a first electrode. In addition, as each of the charge transfer devices has just a single transfer gate which is maintained at a fixed potential, drive voltage feedthrough from the second storage electrodes to the first storage electrodes is avoided.

While the invention has been described in connection with shift registers to provide a sequence of reference bits for controlling the charge storage cells, other means may be used. For example, the gates of transistors 61 and 62 may be connected to the outputs of read only or random access memories and the reference word determined by the data stored and addressed therein. Also, while one manner of applying the first and second waveform to the second electrodes of the devices has been shown and described, it is apparent that alternative means may be utilized.

While the invention has been described in connection with charge transfer devices constituted of N-type conductivity substrates, P-type conductivity substrates could as well be used. Of course, in such a case the applied potentials, diffusions and carrier types would be reversed in polarity.

While the invention has been described in a specific embodiment, it will be appreciated that modifications may be made by those skilled in the art, and it is intended by the appended claims to cover all such modifications and changes as fall within the true spirit and scope of the invention.

What I claim as new and desire to secure by Letters Patent of the United States is:

1. Signal correlator apparatus comprising
   a substrate of semiconductor material having a major surface,
   first means forming a first plurality of charge storage regions adjacent said major surface of said substrate,
   second means forming a second plurality of charge storage regions adjacent said major surface of said substrate, each separated from a respective charge storage region of said first plurality by a respective intermediate region and forming a respective charge storage cell therewith,
   said first means including a first plurality of electrodes, each electrode insulating overlying a respective charge storage region of said first plurality, said electrodes being interconnected,
   said second means including a second plurality of electrodes, each insulatingly overlying a respective charge storage region of said second plurality,
   means for introducing into each of successive ones of said first charge storage regions a respective one of successive quantities of charge, each quantity being proportional to a respective sample of a time varying analog signal,
   means for applying to each of said second storage electrodes a voltage waveform selected from a first voltage waveform and a second voltage waveform of the same periodicity in response to a respective one of a series of successive binary bits of a reference word,
   a. the bits of a first value in said series of bits forming a first group of bits and providing said first voltage waveform to the second electrodes associated with a first group of cells, said first voltage waveform causing charges to be transferred during a first interval of a period thereof from the first charge storage regions of said first group of cells to the second charge storage regions thereof, and causing said transferred charge to be returned during a second interval,
   b. the bits of a second value in said series of bits forming a second group of bits and providing said second voltage waveform to the second electrodes associated with a second group of cells, said second voltage waveform causing charge to be transferred from first charge storage regions of said second group of cells to the second charge storage regions thereof during said second interval,
   means connected in circuit with said first storage electrodes for sensing the total net charge transferred to and from said first charge storage regions during said second interval.

2. The apparatus of claim 1 in which said substrate of semiconductor material is of one conductivity type and said quantities of charge are in the form of minority carriers in said substrate and in which substantially all of the stored charge of a cell is transferred during said second interval.

3. The apparatus of claim 2 in which is provided
   a plurality of first gating electrodes, each insulatingly overlying a respective intermediate region, said gating electrodes being interconnected,
   means for applying a fixed first potential to said first gating electrodes to establish a depletion surface potential in each of said intermediate regions of a first value,
   means for applying during said first interval a second potential to said first storage electrodes to establish a depletion surface potential of a second value in each of said first storage regions, said second value being less in absolute magnitude than said first value.

4. The apparatus of claim 1 in which is provided means for periodically shifting each of the successive bits of said binary reference word one bit position with respect to the successive cells controlled thereby with the same periodicity as said first and second voltage waveforms.

5. The apparatus of claim 4 in which is provided a first shift register in which the successive bits of said reference word are stored therein, said successive bits being shifted serially in one direction one bit position at a time at the periodicity of said first and second voltage waveforms.

6. The apparatus of claim 1 in which said first and second voltage waveforms include a third interval during which charge is excluded from all of said second charge storage regions and during which charge is reestablished in selected cells in accordance with an analog signal.

7. The apparatus of claim 6 in which a scan shift register is provided and in which the selected cells consist of a single cell which is determined by the position of a scan bit in said scan shift register, and which also includes means for applying a scan bit to the input of said shift register, and means synchronized with said first and second voltage waveforms for shifting said scan bit, whereby said stored samples constitute a series of sequential samples of an analog input signal.

8. The apparatus of claim 3 in which said first voltage waveform establishes a first level of depletion surface potential in the second storage regions of said first group of cells during a first interval thereof and a second level of depletion surface potential during a succeeding second interval thereof, said first level of depletion surface potential being greater in absolute magnitude than said fixed first value of depletion surface potential and said second level of depletion surface potential being less in absolute magnitude than said fixed second value of depletion surface potential, and in which said second voltage waveform establishes said second level of depletion surface potential in said second storage region during said first interval and said first level of depletion surface potential during said second interval, said second level of depletion surface potential in said second storage regions providing blockage of charge therein and said first level of depletion surface potential providing storage of charge therein.

* * * * *